(12) United States Patent
Kuroda

(10) Patent No.: US 7,075,340 B2
(45) Date of Patent: Jul. 11, 2006

(54) SOLID-STATE IMAGING DEVICE

(75) Inventor: Takao Kuroda, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 28 days.

(21) Appl. No.: 10/844,319

(22) Filed: May 13, 2004

(65) Prior Publication Data

US 2004/0227563 A1   Nov. 18, 2004

(30) Foreign Application Priority Data

May 15, 2003   (JP) ............................. 2003-137832

(51) Int. Cl.
*H03K 17/00* (2006.01)
(52) U.S. Cl. ........................ 327/93; 327/390; 327/427
(58) Field of Classification Search ................ 327/390, 327/530, 536, 50, 91, 93, 427
See application file for complete search history.

(56) References Cited

U.S. PATENT DOCUMENTS

| | | | | |
|---|---|---|---|---|
| 5,646,571 A | * | 7/1997 | Ohashi | 327/390 |
| 5,672,992 A | * | 9/1997 | Nadd | 327/390 |
| 5,689,208 A | * | 11/1997 | Nadd | 327/390 |
| 5,767,729 A | * | 6/1998 | Song | 327/390 |
| 5,770,967 A | * | 6/1998 | Alzati et al. | 327/390 |
| 6,107,864 A | * | 8/2000 | Fukushima et al. | 327/536 |
| 6,188,265 B1 | * | 2/2001 | Liu et al. | 327/390 |
| 6,242,970 B1 | * | 6/2001 | Grant et al. | 327/536 |
| 6,483,376 B1 | * | 11/2002 | Bienvenu et al. | 327/536 |
| 6,836,173 B1 | * | 12/2004 | Yang | 327/390 |
| 6,844,769 B1 | * | 1/2005 | Yamamoto et al. | 327/333 |

FOREIGN PATENT DOCUMENTS

JP   P2002-231889   8/2002

* cited by examiner

*Primary Examiner*—Terry D. Cunningham
(74) *Attorney, Agent, or Firm*—McDermott Will & Emery LLP

(57) ABSTRACT

A first bias voltage to be applied to a drain portion of a MOS transistor and a pulse voltage pulsating with a predetermined potential difference are being generated by an apparatus incorporating the MOS transistor. Voltage generation means generates a second bias voltage to be applied to a gate portion of the MOS transistor, based on a value of the predetermined potential difference of the pulse voltage generated in the apparatus incorporating the MOS transistor, a value of the first bias voltage generated in the apparatus incorporating the MOS transistor, and a channel potential of a channel portion provided beneath the gate portion of the MOS transistor. Superposition means generate a voltage to be applied to the gate portion of the MOS transistor by superposing the pulse voltage onto the second bias voltage generated by the voltage generation means.

11 Claims, 11 Drawing Sheets

SOLID-STATE IMAGING DEVICE

BACKGROUND OF THE INVENTION

1. Field of the Invention

The present invention relates to a voltage generation device, and more particularly to a voltage generation device for generating a voltage to be applied to a gate portion of a MOS transistor when performing a reset by transferring a charge which is stored in a source portion to a drain portion of the MOS transistor.

2. Description of the Background Art

In the upper half of FIG. 10 is shown a conventional structure of a part of a horizontal transfer register (HCCD) of a CCD solid-state imaging device, as well as a charge detection section for detecting a signal charge having been transferred from the HCCD. The lower half of FIG. 10 shows potentials of the respective portions in the HCCD and the charge detection section. Hereinafter, the structure and operation of the conventional HCCD and charge detection section will be briefly described.

The HCCD includes electrodes 1001 to 1003. The electrode 1001 is a transfer gate electrode, to which a clock voltage $\phi H1$ is applied. The electrodes 1002 and 1003 are transfer gate electrodes, to which a clock voltage $\phi H2$ is applied. The clock voltages $\phi H1$ and $\phi H2$ have the same clock frequency, but are opposite in phase. The clock voltages $\phi H1$ and $\phi H2$ applied to these electrodes create a potential difference of $\phi h$ within the HCCD. Due to this potential difference $\phi h$, the signal charge is transferred from the left to right in FIG. 10.

The charge detection section comprises an electrode 1004, a source portion 1005, a reset gate portion 1006, a drain portion 1007, a channel portion 1008, and an amplifier 1009. A voltage VOG is applied to the electrode 1004. The signal charge 1010 which has been transferred from the HCCD is stored in the source portion 1005. The source portion 1005 is connected to the amplifier 1009. The amplifier 1009 converts the signal charge 1010 to a voltage, and outputs the voltage to outside of the charge detection section.

In order to perform a reset by draining the signal charge 1010 stored in the source portion 1005 to the drain portion 1007, a bias voltage Vb and a clock voltage $\phi R$ as shown in FIG. 11 are applied to the reset gate portion 1006. The channel portion 1008 previously has a channel potential $\phi ch$. The potential of the channel portion 1008 is increased by $\phi b$ with the bias voltage Vb being applied to the gate electrode, and varies by $\phi cl$ due to the clock voltage $\phi R$.

A predetermined voltage VRD is applied to the drain portion 1007 in order to drain out the signal charge which comes in from the source portion 1005 by the action of the reset gate portion 1006.

Now, the operation of the conventional charge detection section having the above structure will be described with reference to the figures. FIG. 12 is a diagram illustrating the potentials of the respective portions when the pulse voltage $\phi R$ is applied to the reset gate portion 1006 of the conventional charge detection section.

As shown in FIG. 12, when the pulse voltage $\phi R$ is applied to the reset gate portion 1006, the channel portion 1008 has a potential of $\phi ch+\phi b+\phi cl$, which is higher than the potential VRD of the drain portion 1007. As a result of this, as shown in FIG. 12, the signal charge 1010 stored in the source portion 1005 is drained to the drain portion 1007, whereby the charge detection section is reset.

The potential VRD and the pulse voltage $\phi R$, which are to be generated within an apparatus which incorporates the charge detection section, vary from apparatus to apparatus. Therefore, for example, if the potential VRD takes its maximum value and the pulse voltage $\phi R$ takes its minimum value under given operating conditions of the apparatus, the potential $\phi ch+\phi b+\phi cl$ of the channel portion 1008 will have a smaller value than that of the potential VRD of the drain portion 1007, as shown in FIG. 13. As a result, the charge detection section suffers from what is called a sub-threshold state in the field of MOS transistors, resulting in a reset residue 3000. Thus, a proper reset is not performed in the charge detection section.

Therefore, in order to prevent the above problem, a relatively large value is chosen for the bias voltage Vb to be applied to the reset gate portion 1006. As described in Japanese Patent Laid-Open Publication No. 2002-231889, for example, the bias voltage Vb having a relatively large prescribed value, may be stored in a storage section in a voltage generation circuit, which in itself is an external element connected to the charge detection section. The voltage generation circuit applies the bias voltage Vb stored in its storage section to the reset gate portion 1006. In this manner, the aforementioned sub-threshold state can be prevented from occurring in the MOS transistor structure.

However, if the value of the bias voltage Vb is too large, as shown in FIG. 14, the reset gate portion 1006 will have an excessively high potential even when the pulse voltage $\phi R$ is not applied thereto. As a result, a saturation-decrease signal charge 4000 occurs, thus deteriorating the saturation characteristics. Thus, in the conventional charge detection section, it is difficult to prescribe the value of the bias voltage Vb to be applied to the reset gate portion 1006.

SUMMARY OF THE INVENTION

Therefore, an object of the present invention is to provide a voltage generation device which makes it possible to apply an optimum bias voltage to a gate portion of a MOS transistor even though the values of a bias voltage and a pulse voltage to be generated in an apparatus incorporating the MOS transistor may vary from apparatus to apparatus.

A voltage generation device according to the present invention is directed to a voltage generation device for generating a voltage to be applied to a gate portion of a MOS transistor when performing a reset by transferring a charge stored in a source portion to a drain portion of the MOS transistor, wherein a first bias voltage to be applied to the drain portion of the MOS transistor and a pulse voltage pulsating with a predetermined potential difference are generated in an apparatus incorporating the MOS transistor, the voltage generation device comprising: voltage generation means for generating a second bias voltage to be applied to the gate portion of the MOS transistor, based on a value of the predetermined potential difference of the pulse voltage generated in the apparatus incorporating the MOS transistor, a value of the first bias voltage generated in the apparatus incorporating the MOS transistor, and a channel potential of a channel portion provided beneath the gate portion of the MOS transistor; and superposition means for generating the voltage to be applied to the gate portion of the MOS transistor by superposing the pulse voltage onto the second bias voltage generated by the voltage generation means.

The voltage generation means may comprise: potential detection means for detecting a potential appearing at the channel portion of the MOS transistor when the pulse voltage is applied to the gate portion of the MOS transistor;

and voltage difference measurement means for measuring a voltage difference between the first bias voltage and the potential detected by the potential detection means, and the voltage generation means may generate the second bias voltage based on the voltage difference measured by the difference measurement means.

The voltage generation means may further comprise amplification means for generating the second bias voltage by multiplying the voltage difference measured by the voltage difference measurement means by a predetermined value.

The predetermined value may be equal to or greater than a ratio of a change in the potential of the channel portion of the MOS transistor when the pulse voltage is applied to the gate portion of the MOS transistor to the predetermined potential difference of the pulse voltage.

The voltage generation means may be composed of a dummy MOS transistor having substantially the same structure as that of the MOS transistor, the pulse voltage is applied to a gate portion of the dummy MOS transistor, a potential of a source portion of the dummy MOS transistor is controlled so as to be equal to a potential which appears at a channel portion provided beneath the gate portion of the dummy MOS transistor when the pulse voltage is applied to the gate portion of the dummy MOS transistor, and the potential detection means may detect the potential of the source portion of the dummy MOS transistor.

A gate length of the gate portion of the dummy MOS transistor may be longer than a gate length of the MOS transistor.

A gate width of the gate portion of the dummy MOS transistor may be narrower than a gate width of the MOS transistor.

A channel potential depth of the channel portion of the dummy MOS transistor may be shallower than a channel potential depth of the MOS transistor.

The channel portion of the MOS transistor and the channel portion of the dummy MOS transistor may be formed by implanting an n-type impurity thereto, and a p-type impurity is further implanted to the channel portion of the dummy MOS transistor.

The MOS transistor and the dummy MOS transistor may be formed on an identical semiconductor substrate through an identical step.

The source portion of the dummy MOS transistor may be shielded from light.

The gate portion of the MOS transistor and the gate portion of the dummy MOS transistor may be electrically connected to each other.

Another aspect of the present invention is directed to a signal charge transfer device comprising: transfer means for transferring a charge based on a clock signal; charge detection means composed of a MOS transistor for outputting an amount of the charge stored in a source portion; and any of the above-described voltage generation devices for generating a voltage to be applied to a gate portion of the charge detection means.

Yet another aspect of the present invention is directed to a solid-state imaging device comprising: imaging means for taking in an image and outputting information of the image as a signal charge; and the aforementioned signal charge transfer device for transferring and outputting the signal charge which is output from the imaging means.

Yet another aspect of the present invention is directed to a voltage generation device for generating a voltage to be applied to a gate portion of a MOS transistor when performing a reset by transferring a charge stored in a source portion to a drain portion of the MOS transistor, comprising: bias generation means for generating a first bias voltage to be applied to the drain portion of the MOS transistor; pulse voltage generation means for generating a pulse voltage pulsating with a predetermined potential difference; voltage generation means for generating a second bias voltage to be applied to the gate portion of the MOS transistor, based on a value of the predetermined potential difference of the pulse voltage generated by the pulse voltage generation means, a value of the first bias voltage generated by the bias generation means, and a channel potential of a channel portion provided beneath the gate portion of the MOS transistor; and superposition means for generating the voltage to be applied to the gate portion of the MOS transistor by superposing the pulse voltage onto the second bias voltage generated by the voltage generation means.

Yet another aspect of the present invention is directed to a solid-state imaging system comprising: imaging means for taking in an image and outputting information of the image as a signal charge; transfer means for transferring the signal charge output from the imaging means based on a clock signal; charge detection means composed of a MOS transistor for outputting a size of the signal charge having been transferred from the transfer means and stored in a source portion; and the voltage generation device according to claim 15 for generating a voltage to be applied to a gate portion of the charge detection means.

Yet another aspect of the present invention is directed to a voltage generation method for generating a voltage to be applied to a gate portion of a MOS transistor when performing a reset by transferring a charge stored in a source portion to a drain portion of the MOS transistor, wherein a first bias voltage to be applied to the drain portion of the MOS transistor and a pulse voltage pulsating with a predetermined potential difference are generated in an apparatus incorporating the MOS transistor, the voltage generation method comprising: a voltage generation step of generating a second bias voltage to be applied to the gate portion of the MOS transistor, based on a value of the predetermined potential difference of the pulse voltage generated in the apparatus incorporating the MOS transistor, a value of the first bias voltage generated in the apparatus incorporating the MOS transistor, and a channel potential of a channel portion provided beneath the gate portion of the MOS transistor; and a superposition step of generating the voltage to be applied to the gate portion of the MOS transistor by superposing the pulse voltage onto the second bias voltage generated by the voltage generation step.

A voltage generation device according to the present invention makes it possible to apply an optimum bias voltage to a gate portion of a MOS transistor even though the values of a bias voltage and a pulse voltage to be generated in an apparatus incorporating the MOS transistor may vary from apparatus to apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
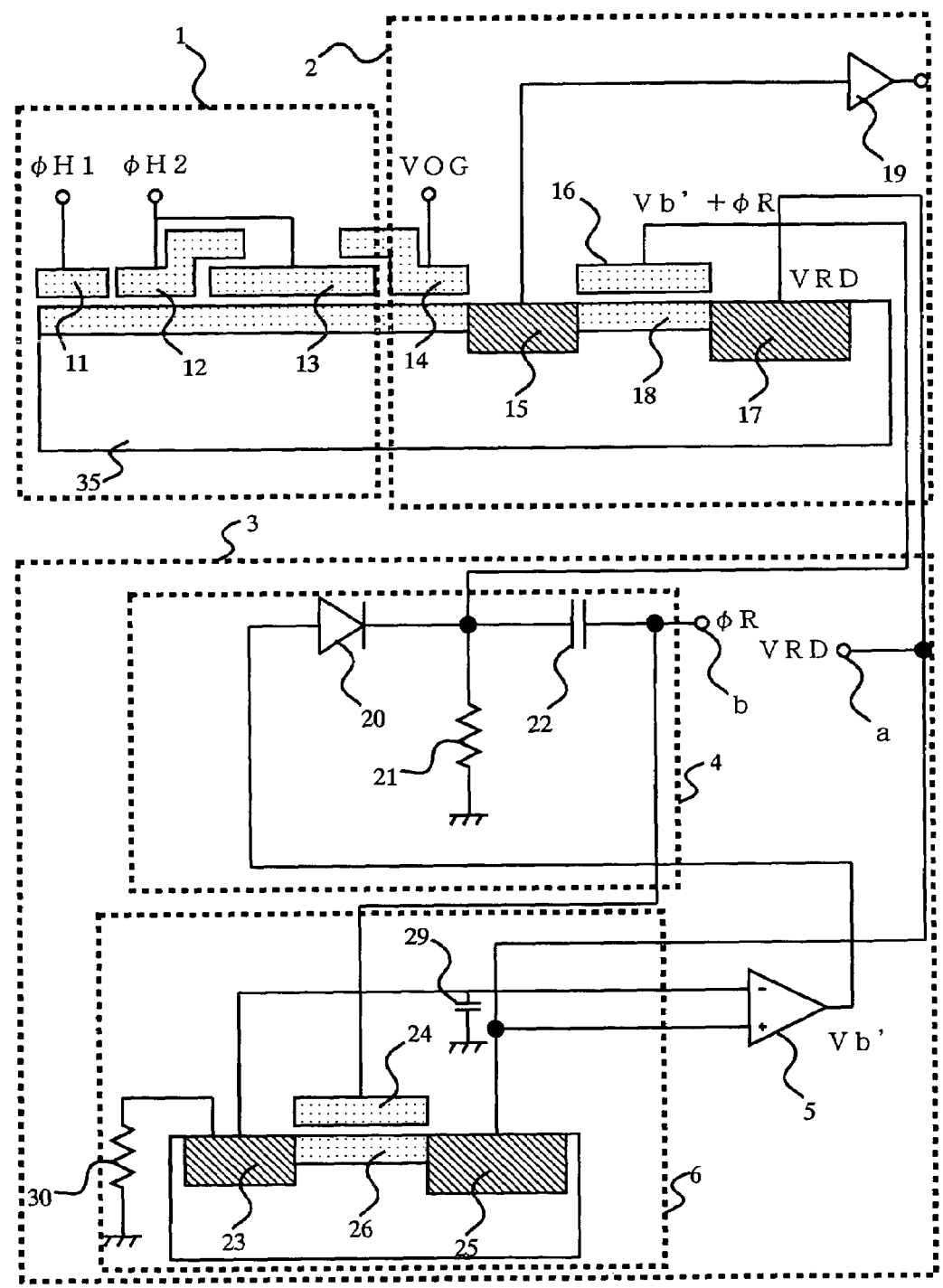
FIG. 1 is a diagram illustrating the structure of a horizontal transfer register (HCCD), a charge detection section, and a voltage generation device according to the present invention.
Figure 2A:
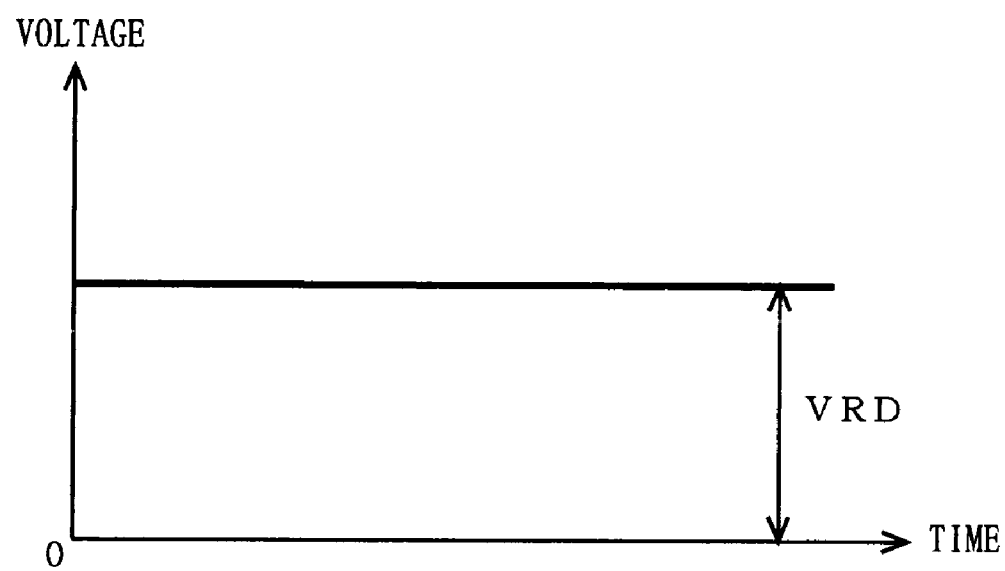
FIG. 2A is a graph illustrating the change over time of a DC voltage VRD to be applied to the voltage generation device according to the present invention.
Figure 2B:
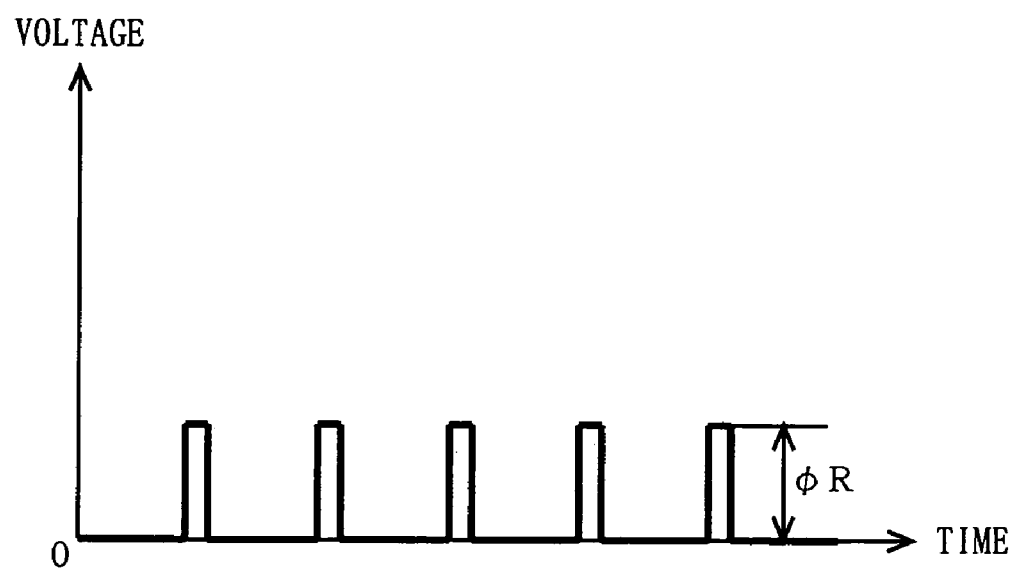
FIG. 2B is a graph illustrating the change over time of a pulse voltage φR to be applied to the voltage generation device according to the present invention.

Hereinafter, a voltage generation device according to one aspect of the present invention will be described with reference to the figures. FIG. 1 is a structural diagram illustrating an apparatus including a horizontal transfer register 1 (HCCD 1; only a part thereof is shown) for use in a CCD solid-state imaging device, a charge detection section 2 for detecting a signal charge having been transferred from the HCCD 1, and a voltage generation device 3 for generating a voltage to be used in the charge detection section 2. FIG. 2A is a graph illustrating the change over time of a DC voltage VRD to be applied to an input terminal a of the voltage generation device 3. FIG. 2B is a graph illustrating the change over time of a pulse voltage φR to be applied to an input terminal b of the voltage generation device 3.

The HCCD 1, which includes electrodes 11 to 13 formed on a semiconductor substrate 35, transfers a signal charge output from an imaging section of the solid-state imaging device, in a left-to-right direction over the surface of the semiconductor substrate 35 as shown in FIG. 1. The electrode 11 is a transfer gate electrode, to which a clock voltage φH1 is applied. The electrodes 12 and 13 are transfer gate electrodes, to which a clock voltage φH2 is applied. The clock voltages φH1 and φH2 have the same clock frequency, but are opposite in phase.

The DC voltage VRD as illustrated in FIG. 2A is applied to the input terminal a, so as to be input to a drain portion 17, a drain portion 25, and a differential amplifier 5 (described later) The pulse voltage φR as illustrated in FIG. 2B is applied to the input terminal b, so as to be input to a capacitor 22 and a reset gate portion 24 (described later).

Next, the voltage generation device 3 will be described. The voltage generation device 3, which is a circuit for generating a voltage to be used in the charge detection section 2, includes a superposition circuit 4, the differential amplifier 5, and a dummy element 6.

Figure 3:
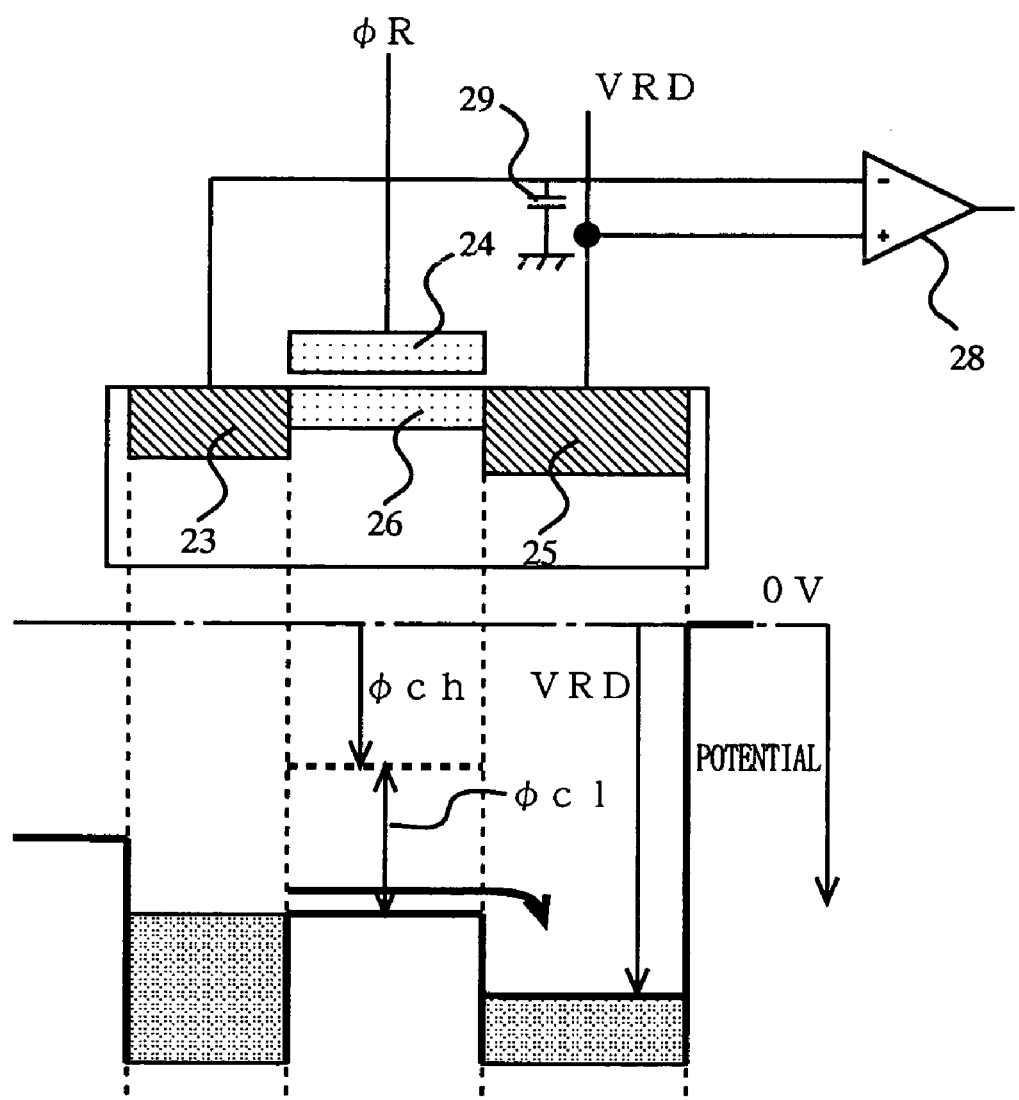
FIG. 3 is a diagram illustrating the structure of a dummy element according to the present invention and potentials of various portions therein.
Figure 4A:
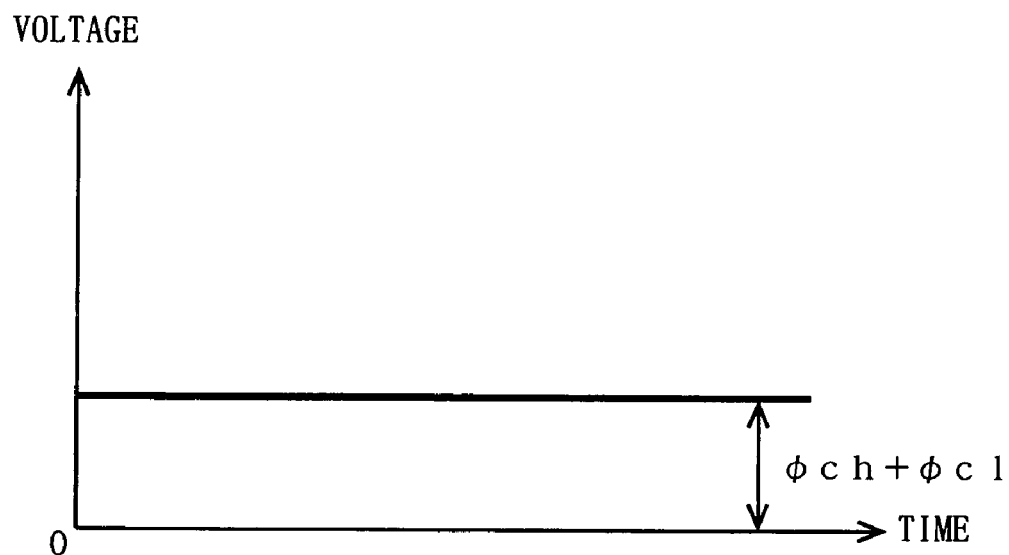
FIG. 4A is a graph illustrating the change over time of a voltage to be applied to a (−) terminal of the differential amplifier according to the present invention.
Figure 4B:
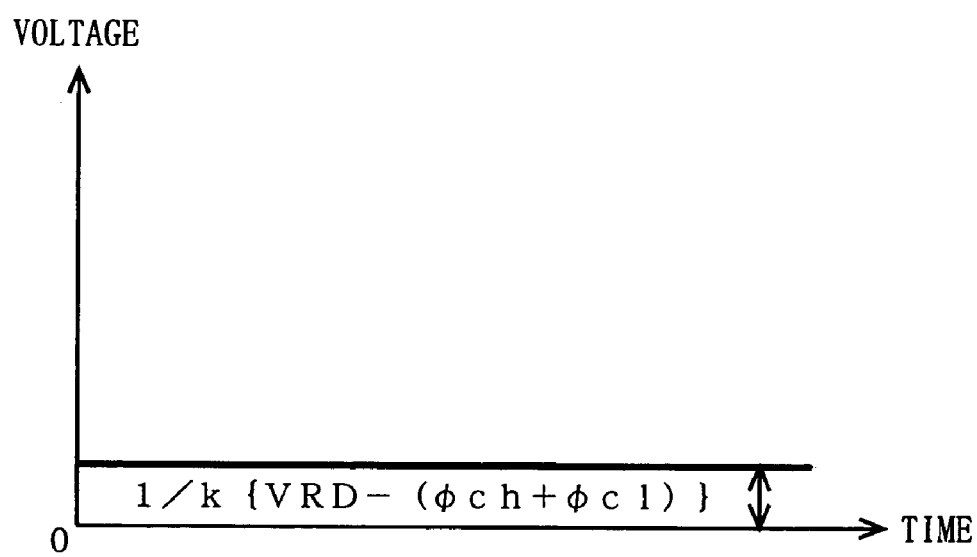
FIG. 4B is a graph illustrating the change over time of a voltage output from the differential amplifier according to the present invention.

The dummy element 6 and the differential amplifier 5 will be described with reference to the figures. FIG. 3 is a diagram illustrating the structure of a dummy element according to the present embodiment of the invention, and potentials of various portions therein. FIG. 4A is a graph illustrating the change over time of a DC voltage to be applied to a (−) terminal of the differential amplifier 5. FIG. 4B is a graph illustrating the change over time of a DC voltage output from the differential amplifier 5. The dummy element 6 includes a source portion 23, the reset gate portion 24, the drain portion 25, a channel portion 26, a capacitor 29, and a resistor 30. Based on the DC voltage VRD and the pulse voltage φR, the dummy element 6 generates a DC voltage Vb' to be applied to a reset gate portion 16 of the charge detection section 2.

The resistor 30 is connected to the source portion 23 in order to supply a charge to the source portion 23. Although the resistor 30 is an optional element, in the case where the potential of the source portion 23 becomes too high because of a temporary excessive decrease in the charge of the source portion 23 due to pulse noise or the like, for example, the resistor 30 will serve to supply a charge to stabilize the potential of the source portion 23. The differential amplifier 5 is also connected to the source portion 23, so that the potential of the source portion 23 is output to the (−) terminal of the differential amplifier 5. The pulse voltage φR as illustrated in FIG. 2B is applied to the reset gate portion 24. The channel portion 26 has a channel potential φch. The potential of the channel portion 26 varies between φch and φcl+φch in a pulsating manner, due to the pulse voltage φR being applied to the reset gate portion 24. It is assumed that φcl is proportional to φR such that φcl=n×φR, where n is a positive coefficient which depends on the physical properties of the channel portion 26.

The capacitor 29 smoothes the pulse voltage which is output from the source portion 23 and outputs the resultant voltage to the differential amplifier 5. Specifically, the capacitor 29 smoothes the output voltage from the source portion 23 (which varies between φch and φcl+φh) so as to stay at φcl+φch. Thus, a DC voltage as illustrated in FIG. 4A is output to the (−) terminal of the differential amplifier 5.

The DC voltage VRD as illustrated in FIG. 2A is applied to the drain portion 25, whereby the potential of the drain portion 25 is always maintained at VRD. The DC voltage VRD applied to the drain portion 25 is also input to the (+) terminal of the differential amplifier 5.

The differential amplifier 5 generates a DC voltage as shown in FIG. 4B by subtracting φcl+φch, which is applied to the (−) terminal, from the DC voltage VRD, which is applied to the (+) terminal, and multiplying the result by 1/k, where k is a positive number which is equal to or less than n. The differential amplifier 5 outputs the generated DC voltage to the superposition circuit 4.

Figure 5:
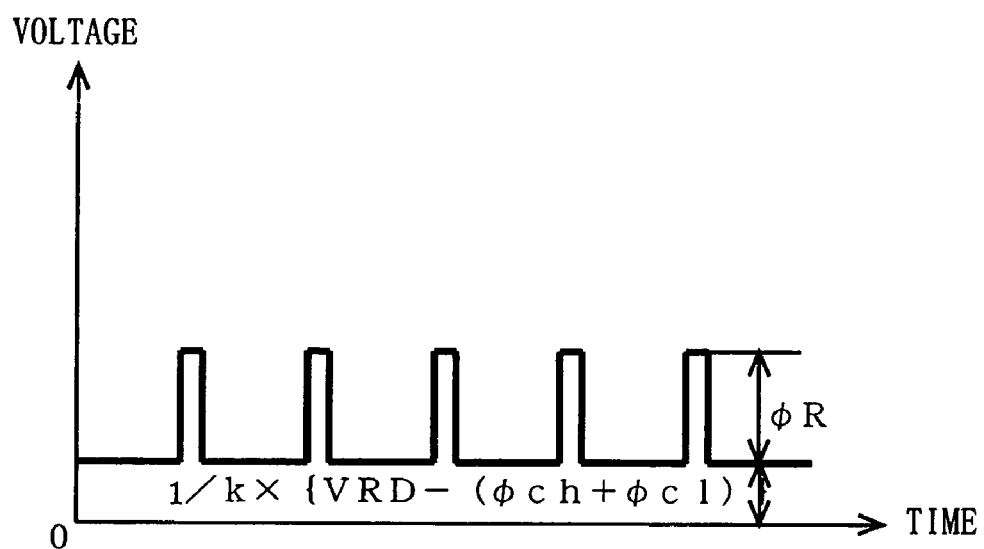
FIG. 5 is a graph illustrating the change over time of a voltage to be applied to a reset gate portion of the charge detection section according to the present invention.

Next, the superposition circuit 4 will be described with reference to the figures. FIG. 5 is a graph illustrating the change over time of a pulse voltage output from the superposition circuit 4.

The superposition circuit 4 includes a diode 20, a resistor 21, and the capacitor 22. The superposition circuit 4 generates the pulse voltage shown in FIG. 5 by superposing the pulse voltage φR, which is input to the capacitor 22, onto a DC voltage 1/k×{VRD−(φch+φcl)}, which is an input voltage to the diode 20. The superposition circuit 4 outputs the generated pulse voltage to the charge detection section 2. Note that the diode 20 is assumed to be an ideal diode which does not cause a drop in voltage. Instead of the diode 20, a MOSFET which is designed to function as a diode between its source and drain may also be used. The aforementioned DC voltage 1/k×{VRD−(φch+φcl)} will hereinafter be referred to as a "bias voltage Vb'".

Next, the charge detection section 2 will be described. The charge detection section 2 includes an electrode 14, a source portion 15, the reset gate portion 16, the drain portion 17, a channel portion 18, and an amplifier 19. A DC voltage VOG is applied to the electrode 14. The signal charge which has been transferred from the HCCD 1 is stored in the source portion 15. The source portion 15 is connected to the amplifier 19. The amplifier 19 converts the signal charge stored in the source portion 15 to a voltage, and outputs the voltage to outside of the charge detection section 2.

In order to perform a reset by draining the signal charge stored in the source portion 15 to the drain portion 17, the bias voltage Vb' and the pulse voltage φR obtained from the superposition circuit 4 are applied to the reset gate portion 16. The channel portion 18 previously has a channel potential φch. The potential of the channel portion 18 is increased by φb' with the bias voltage Vb' being applied to the reset gate portion 16, and varies by φcl due to the pulse voltage φR. Note that Vb' and φb' satisfy the relationship φb'=n×Vb', and that φR and φcl satisfy the relationship φcl=n×φR. Herein, n is identical to the constant n which has been described with reference to the dummy element 6 because the transistor in the charge detection section 2 and the transistor in the dummy element 6 are formed simultaneously within the same chip by using the same technique.

A predetermined voltage VRD is applied to the drain portion 17. If a voltage equal to or greater than a certain value is applied to the reset gate portion 16, signal charge flows in from the source portion 15 via the channel portion 18.

The operations of elements in the HCCD 1, the charge detection section 2, and the voltage generation device 3 will hereinafter be described. First, an operation in which the voltage generation device 3 generates the pulse voltage as shown in FIG. 5 will be described.

The DC voltage VRD as shown in FIG. 2A is input to the input terminal a. The DC voltage VRD is applied to the (+) terminal of the differential amplifier 5 and the drain portion 25.

On the other hand, the pulse voltage φR as shown in FIG. 2B is input to the input terminal b. The pulse voltage φR is applied to the reset gate portion 24. In response, the potential of the channel portion 26 varies between φch and φch+φcl.

In response to such changes in the potential of the channel portion 26, the charge stored in the source portion 23 moves to the drain portion 25, in accordance with the potential of the channel portion 26. As the changes in the potential of the channel portion 26 are repeated, the potential of the source portion 23 gradually approximates φch+φcl, so that the voltage φch+φcl is output from the source portion 23.

Meanwhile, the capacitor 29 serves to smooth the voltage which is output from the source portion 23, and output the resultant voltage to the differential amplifier 5. As a result, the DC voltage φch+φcl as show in FIG. 4A is input to the differential amplifier 5. Therefore, the time constant which is defined by the resistor 30 and the capacitor 29 is to be prescribed to be sufficiently longer than the period of φR.

The differential amplifier 5 subtracts the DC voltage φch+φcl, which is output from the source portion 23, from the DC voltage VRD obtained from the input terminal a. The result of the subtraction VRD−(φch+φcl) would represent a difference between the potential appearing at the channel portion 18 and the potential of the drain portion 17 in an imaginary case where only φR was applied to the channel portion 18. The differential amplifier 5 multiplies the result of the subtraction VRD−(φch+φcl) by 1/k, and outputs the result of the multiplication as Vb' to the superposition circuit 4.

The superposition circuit 4 superposes the pulse voltage φR which is input to the input terminal b onto the bias voltage Vb' which is output from the differential amplifier 5. As a result, the pulse voltage as shown in FIG. 5 is output from the superposition circuit 4. Thus, the operation in which the voltage generation device 3 generates the pulse voltage as shown in FIG. 5 has been described.

Figure 6:
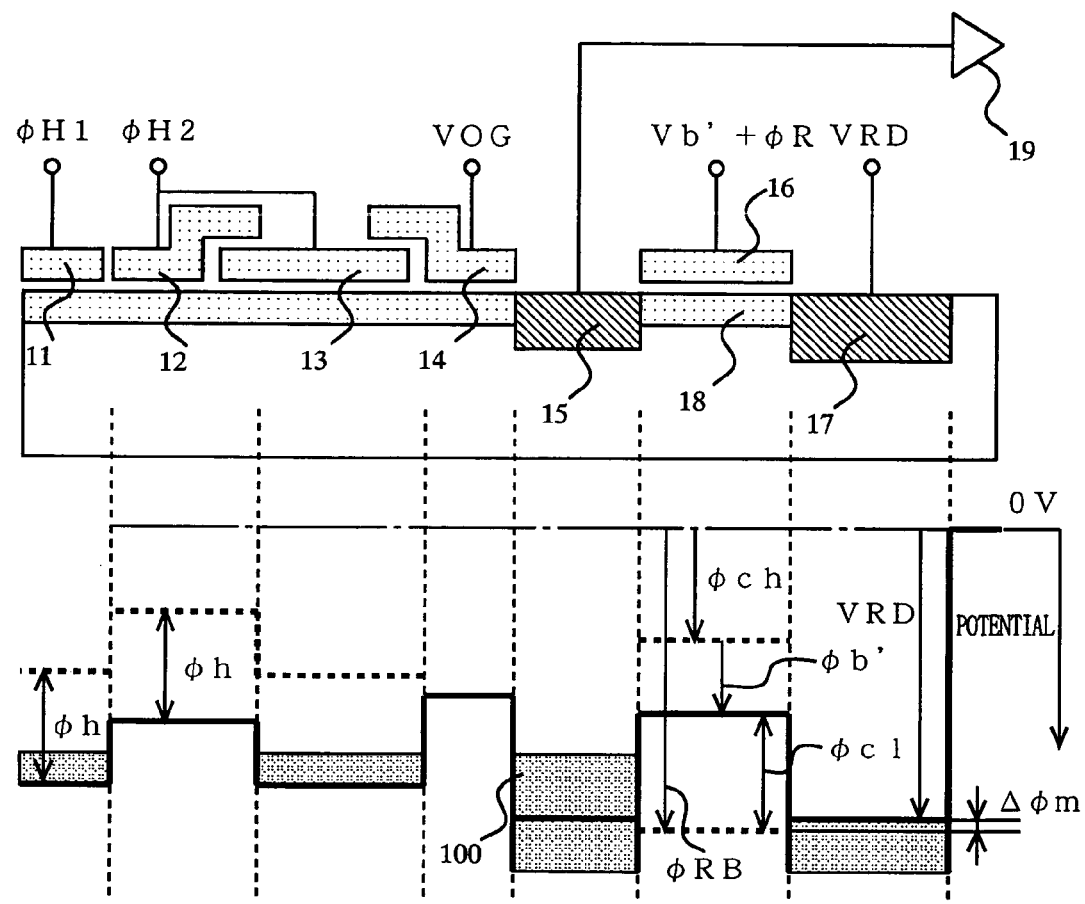
FIG. 6 is a diagram showing potentials of various portions of the charge detection section according to the present invention.
Figure 7:
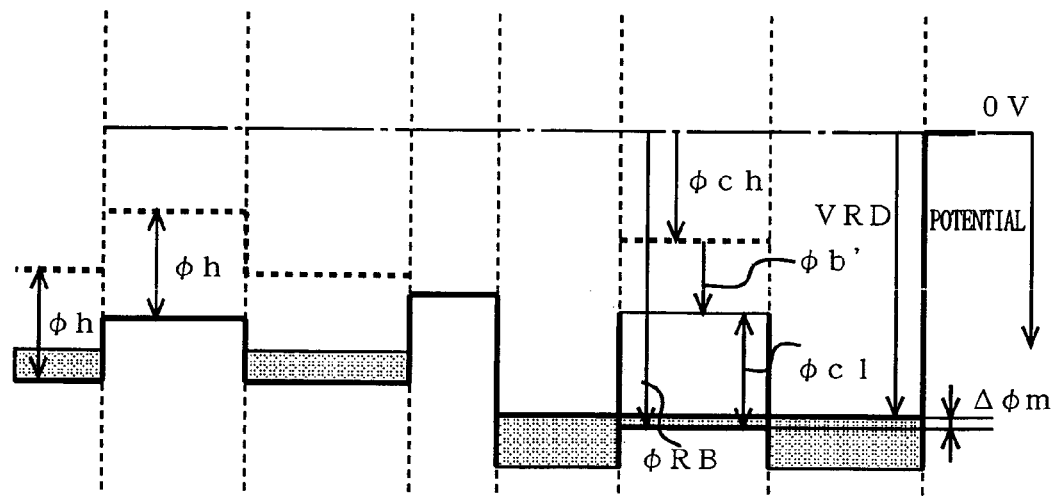
FIG. 7 is a diagram showing potentials of various portions of the charge detection section according to the present invention during a reset operation.

Next, a reset operation by the charge detection section 2 will be described. FIG. 6 is a diagram showing potentials of various portions of the charge detection section 2 according to the present embodiment in the case where signal charge is stored in the source portion 15. FIG. 7 is a diagram showing potentials of various portions of the charge detection section 2 during a reset operation.

As described above, the voltage generation device 3 generates the pulse voltage as shown in FIG. 5 by superposing the pulse voltage φR onto Vb'=1/k×{VRD−(φch+φcl)}, and outputs the pulse voltage to the reset gate portion 16 of the charge detection section 2.

The pulse voltage as shown in FIG. 5 being applied to the reset gate portion 16 causes the potential of the channel portion 18 to vary between φch+φb' and φch+φb'+φcl. Hereinafter, the potentials of various portions in the case where the voltage Vb'+φR is applied to the reset gate portion 16 will be described.

When the voltage Vb'+φR is applied to the reset gate portion 16, as shown in FIG. 7, the potential of the channel portion 18 shifts to φch+φb'+φcl.

Since φb' and Vb' satisfy the relationship φb'=nVb' and the relationship Vb'=1/k×{VRD−(φch+φcl)}, the potential φch+φb'+φcl of the channel portion 18 can be reexpressed as n/k×VRD+(1−n/k)(φch+φcl) based on these two equations. Since k is a positive number which is equal to or less than n, the potential of the channel portion 18 is equal to or greater than the potential VRD of the drain portion 17. Therefore, the signal charge in the source portion 15 is drained to the drain portion 17, whereby the charge detection section 2 is reset.

Now, a method for setting k will be described, assuming the following exemplary operating conditions for the present embodiment: VRD=15V; and the frequency of the pulse voltage φR is 10 MHz. Under such operating conditions, in order for the charge detection section 2 to be reset, i.e., in order for the signal charge 100 stored in the source portion 15 to flow into the drain portion 17, there must be about 0.1V of a difference $\Delta\phi m$ between the potential VRD of the drain portion 17 and the potential $\phi ch+\phi b'+\phi cl$ of the channel portion 18.

Therefore, in the voltage generation device 3, n, $\phi ch$, and $\phi cl$ may be obtained through experimentation, and a k value may be calculated such that the difference between n/k× RD+(1−n/k) ($\phi ch+\phi cl$) and VRD equals 0.1V. In the case where the frequency of the pulse voltage $\phi R$ is 100 MHz, the k value shall be set so that $\Delta\phi m$ equals about 0.5V.

Thus, in accordance with the charge detection section and the voltage generation device of the present embodiment, the bias voltage Vb' is determined based on the actually-occurring DC voltage VRD, pulse voltage $\phi R$, and channel potential $\phi ch$. Therefore, even if the DC voltage VRD or the pulse voltage $\phi R$ varies, an optimum bias voltage Vb' can be generated.

Moreover, in accordance with the charge detection section and the voltage generation device of the present embodiment, the bias voltage Vb' is determined based on the DC voltage VRD and the pulse voltage $\phi R$, which may vary depending on the manner of use. Therefore, elements for storing the bias voltage Vb' and the like can be eliminated.

The conventional practice has been to detect the channel potential $\phi ch$ during manufacture, determine the bias voltage Vb to be applied to the reset gate portion by using design values of the DC voltage VRD and the pulse voltage $\phi R$, and store the value of the bias voltage Vb in the storage section of the voltage generation circuit. Therefore, during manufacture of each device, it has conventionally been necessary to detect the channel potential $\phi ch$ of the device.

On the other hand, in the voltage generation device according to the present embodiment, the bias voltage Vb' is generated while detecting the fluctuating channel potential $\phi ch$ in the charge detection section. Thus, it is unnecessary to detect the channel potential $\phi ch$ during manufacture, and an optimum bias voltage Vb' can be generated even if the channel potential $\phi ch$ fluctuates.

Moreover, in accordance with the charge detection section and the voltage generation device of the present embodiment, an optimum bias voltage Vb' can be generated in real time, by constantly detecting the DC voltage VRD and the pulse voltage $\phi R$.

Although the present embodiment illustrates an example where the bias voltage Vb' is generated by employing the differential amplifier 5 to multiply the voltage output from the dummy element 6 by 1/k, the method for generating the bias voltage Vb' is not limited thereto. Specifically, by prescribing the gate length of the reset gate portion 24 of the dummy element 9 to be longer than the gate length of the reset gate portion 16 of the charge detection section 2, the potential of the source portion 23 can be reduced. As a result, the potential which is output from the source portion 23 to the differential amplifier becomes lower. In this manner, too, it is possible to ensure that the potential of the reset gate portion 16 of the charge detection section 2 during a reset is higher than the DC voltage VRD.

Similarly, by prescribing the gate width of the reset gate portion of the dummy element to be smaller than the gate width of the reset gate portion of the charge detection section, it is also possible to ensure that the potential of the gate portion of the charge detection section during a reset is higher than the DC voltage VRD.

Further similarly, another method for ensuring that the potential of the gate portion of the charge detection section during a reset is higher than the DC voltage VRD is to prescribe the channel potential depth of the channel portion of the dummy element 6 to be shallower than the channel potential depth of the reset gate portion 16 of the charge detection section 2.

It is preferable that the source portion 23 of the dummy element 6 according to the present embodiment is shielded from light. More specifically, it is preferable to extend the width of a metal wire (e.g., aluminum) which is connected to the source portion 23 so as to cover the source portion. As a result, electron generation due to light being incident to the source portion can be prevented, whereby the potential of the source portion can be stabilized.

The channel portions 18 and 26 of the charge detection section 2 and the dummy element 6, respectively, are generally created by implanting an n-type impurity to a p-type semiconductor. Therefore, by further implanting a p-type impurity in only the channel portion 26 of the dummy element 6, the density of the channel portion 26 can be reduced, and the channel potential of the channel portion 26 of the dummy element 6 can be made lower than the channel potential of the channel portion 18 of the charge detection section 2. Thus, the potential which is output from the source portion 23 to the differential amplifier 5 can also be lowered by lowering the channel potential of the channel portion 26 of the dummy element 6, thus ensuring that the potential of the reset gate portion 16 of the charge detection section 2 during a reset is higher than the DC voltage VRD.

Figure 8:
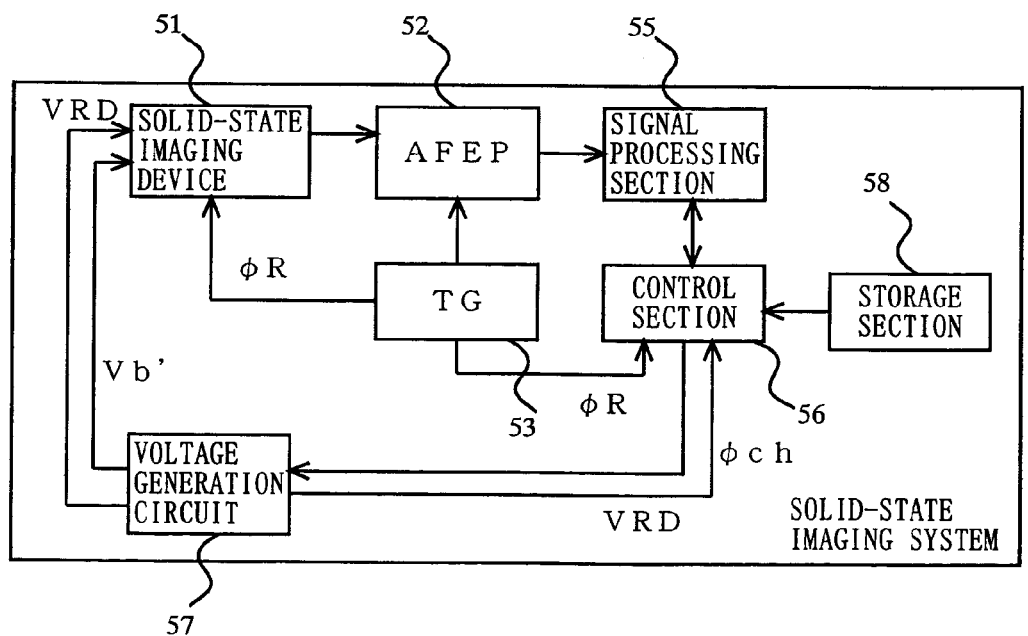
FIG. 8 is a block diagram illustrating the overall structure of a solid-state imaging system according to the present invention.

Although the present embodiment illustrates an example where the bias voltage Vb' is calculated by employing the dummy element 6, the method for calculating the bias voltage Vb is not limited thereto. In other words, the bias voltage Vb' may be calculated by means of an electrical circuit or by software means, so long as the bias voltage Vb' is calculated based on the DC voltage VRD applied to the drain portion 25, the pulse voltage $\phi R$ applied to the reset gate portion 24 and the channel potential of the channel portion 18 of the charge detection section 2. Hereinafter, an example in which the bias voltage Vb' is calculated by software means will be described with reference to the figures. FIG. 8 is a block diagram illustrating the overall structure of a solid-state imaging system according to the present invention.

The solid-state imaging system comprises a solid-state imaging device 51, an analog front-end processor (AFEP) 52, a timing generator (TG) 53, a signal processing section 55, a control section 56, a voltage generation circuit 57, and a storage section 58.

Figure 9:
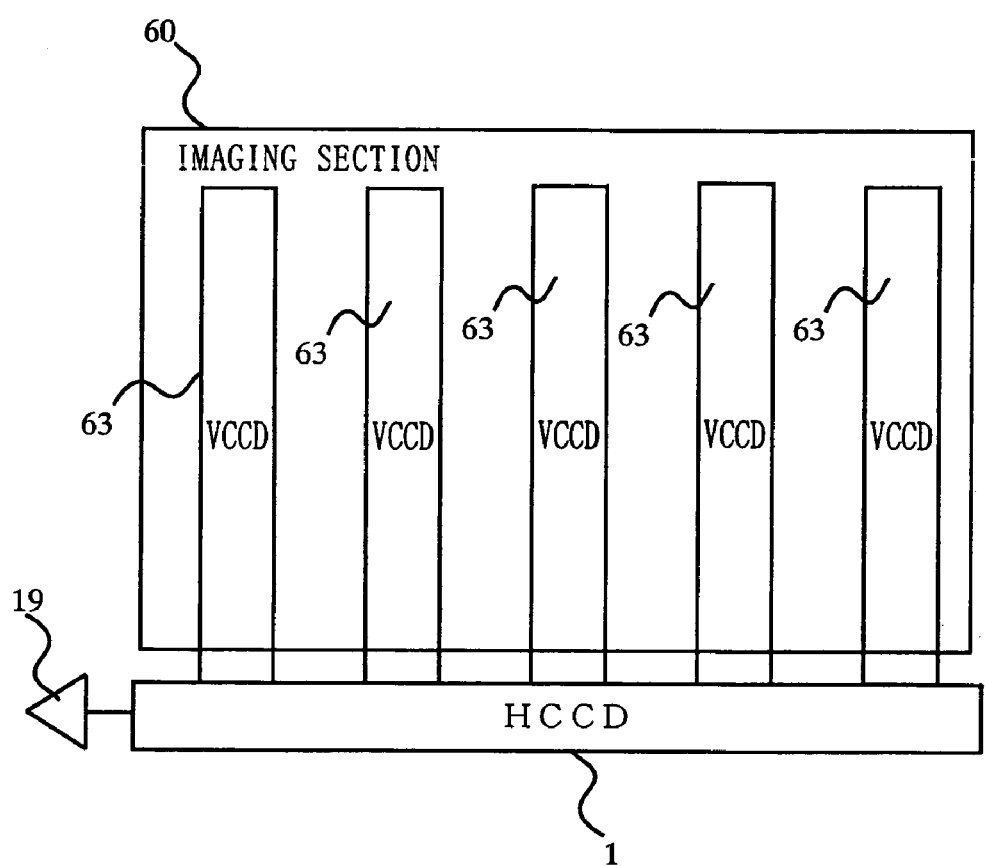
FIG. 9 is a block diagram illustrating the overall structure of a solid-state imaging device according to the present invention.
Figure 10:
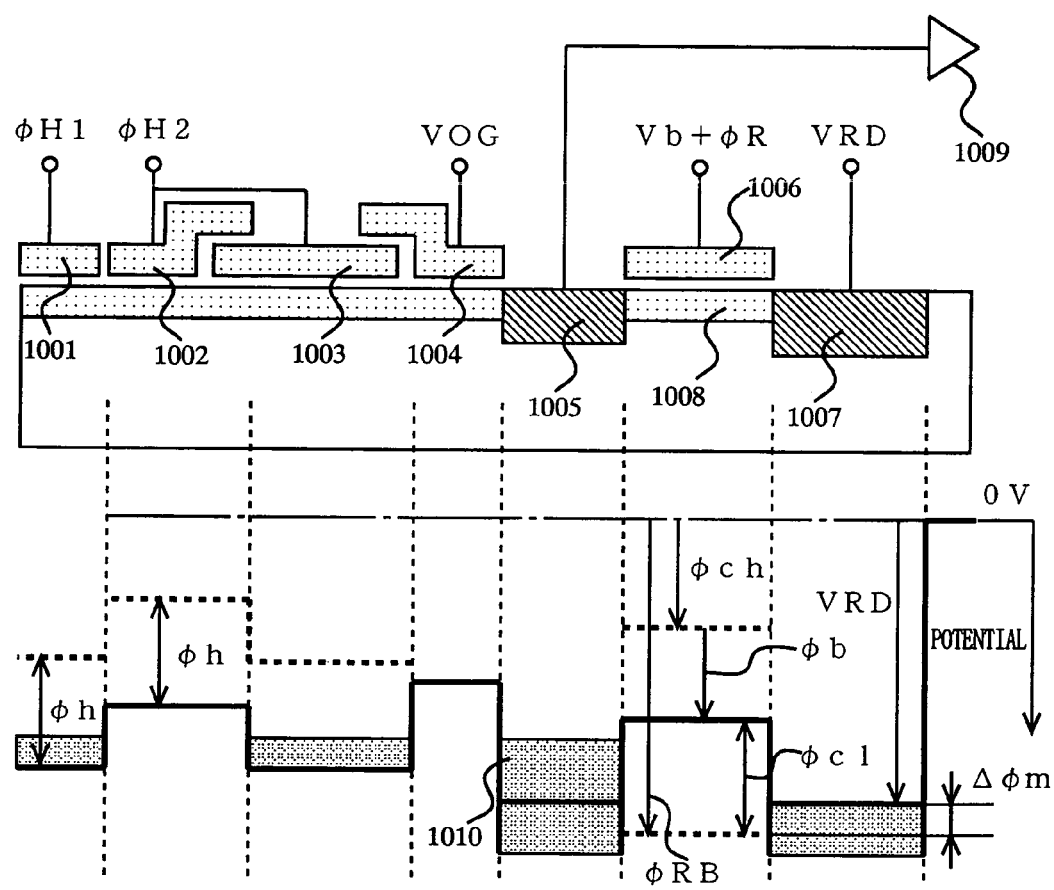
FIG. 10 is a diagram showing the structure of a conventional HCCD and a conventional charge detection section, as well as potentials of various portions thereof.
Figure 11:
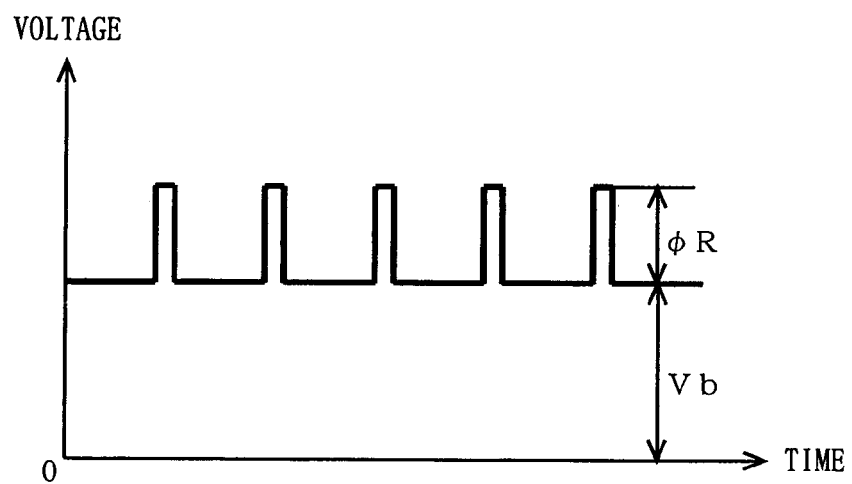
FIG. 11 is a graph illustrating the change over time of voltages to be applied to a reset gate portion of a conventional charge detection section.
Figure 12:
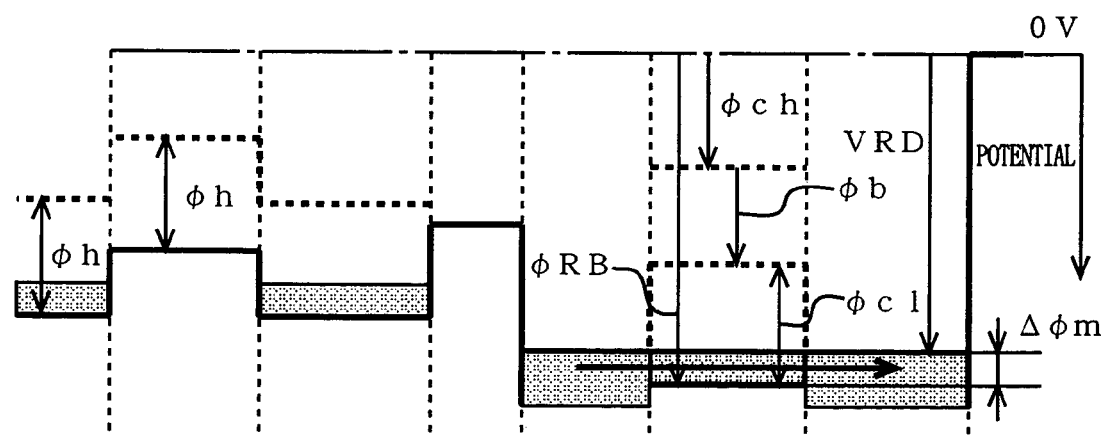
FIG. 12 is a diagram illustrating potentials of various portions of a conventional charge detection section during a reset operation.
Figure 13:
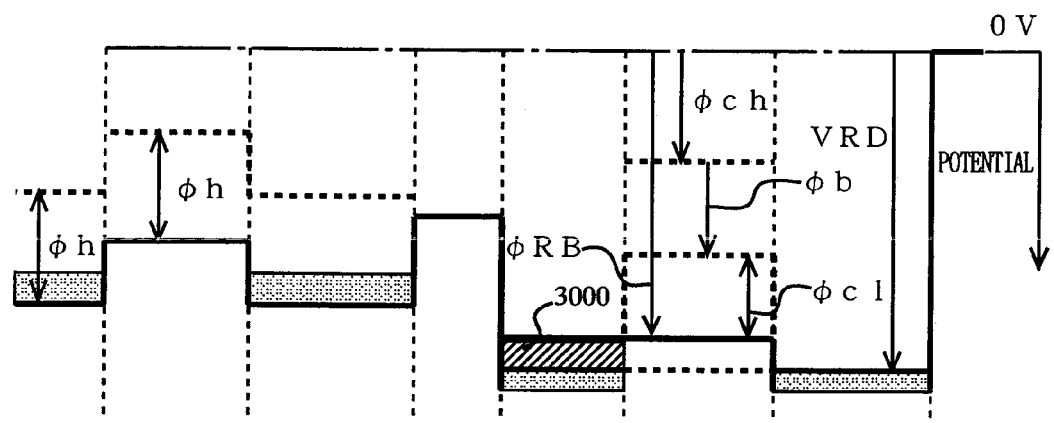
FIG. 13 is a diagram illustrating potentials of various portions of a conventional charge detection section during a reset operation, in the case where a DC voltage VRD is too high and a pulse voltage φch is too low.
Figure 14:
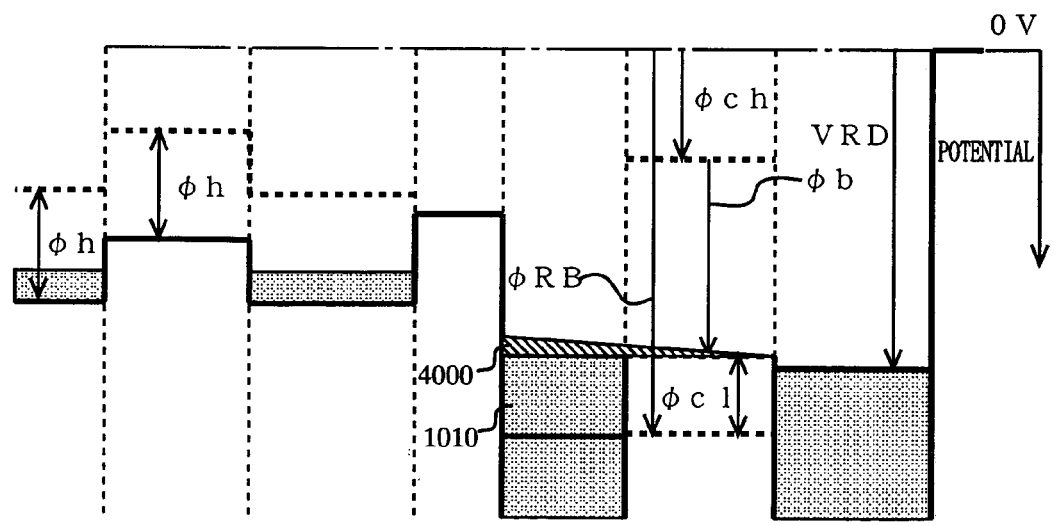
FIG. 14 is a diagram illustrating potentials of various portions of a conventional charge detection section during a reset operation, in the case where a bias voltage Vb is too high.

As shown in FIG. 9, the solid-state imaging device 51 comprises an imaging section 60, an HCCD 1, an amplifier 19, and vertical charge transfer elements (VCCDs) 63, and outputs a signal representing an imaged picture as a voltage signal to the AFEP 52. Note that the charge detection section 2 and the superposition circuit 4 shown in FIG. 1 are to be provided between the HCCD 1 and the amplifier 19. In the solid-state imaging system, the operation of generating the bias voltage Vb' is performed by the control section 56; therefore, the differential amplifier 5 and the dummy element 6 are unnecessary.

The imaging section 60 is composed of a plurality of elements including photodiodes, each of which converts an input optical signal to a signal charge and outputs it to a corresponding VCCD63. Based on a clock signal, the VCCD63 outputs the signal charge to the HCCD 1. The HCCD 1, which corresponds to the HCCD 1 shown in FIG. 1, transfers the signal charge in a right-to-left direction in FIG. 9. The charge detection section 2 composed of a MOS transistor is provided near an output section of the HCCD 1. The amplifier 19, which corresponds to the amplifier 19 shown in FIG. 1, converts the signal charge to a voltage value and outputs it to the AFEP 52.

The AFEP 52 performs processes such as amplification for the input voltage signal, and converts it to a digital signal for output to the signal processing section 55. The signal processing section 55 performs processes such as generating a video signal based on the output signal from the imaging section 60. The TG 53 generates a pulse voltage φR for operating the AFEP 52 and the solid-state imaging device 51. The pulse voltage φR is to be input to the input terminal b shown in FIG. 1. The voltage generation circuit 57 generates a DC voltage VRD to be applied to the drain portion 17 of the charge detection section 2. The DC voltage VRD is to be input to the input terminal a shown in FIG. 1. The storage section 58 stores the channel potential φch of the channel portion 18 of the charge detection section 2. Based on the DC voltage VRD, the pulse voltage φR, and the channel potential φch, the control section 56 calculates an optimum bias voltage Vb' to be applied to the reset gate portion 16 of the charge detection section 2.

In the solid-state imaging system having the above structure, an operation of generating the bias voltage Vb' to be applied to the reset gate portion 16 will be described.

Once the solid-state imaging device 51 begins operating, the control section 56 acquires the channel potential φch from the storage section 58, VRD from the voltage generation circuit 57, and a pulse voltage φR from the TG 53. Then, the control section 56 calculates the bias voltage Vb' based on these acquired voltages.

Next, the control section 56 controls the voltage generation circuit 57 to generate the DC voltage VRD, and generate an optimum bias voltage Vb'. The TG 53 generates and outputs the pulse voltage φR. The charge detection section 2 in the solid-state imaging device 51 receives the bias voltage Vb', the pulse voltage φR, and the DC voltage VRD. As a result, the charge detection section 2 can perform a reset operation by using the optimum bias voltage Vb'.

Although it is assumed in the present embodiment that the voltage generation device is a device for generating a voltage for a charge detection section which is connected to an HCCD of a solid-state imaging device, it will be appreciated that the voltage generation device may be used in conjunction with any element other than a charge detection section connected to an HCCD of a solid-state imaging device.

While the invention has been described in detail, the foregoing description is in all aspects illustrative and not restrictive. It is understood that numerous other modifications and variations can be devised without departing from the scope of the invention.

What is claimed is:

1. A solid-state imaging device comprising:
a transfer register for transferring a signal charge;
a charge detection section, including a MOS transistor having a gate portion and first and second portions, for storing the signal charge from the transfer register in the first portion, outputting the signal charge from the first portion, and draining the signal charge from the first portion to the second portion; and
a voltage generation device for generating a voltage to be applied to the gate portion of the MOS transistor such that the signal charge stored in the first portion of the MOS transistor is drained to the second portion, wherein the voltage generation device includes a dummy MOS transistor having substantially the same structure as that of the MOS transistor and superposition means,
a first voltage to be provided to the second portion of the MOS transistor is provided to a second portion of the dummy MOS transistor,
a first pulse voltage is provided to a gate portion of the dummy MOS transistor,
a second voltage is outputted from a first portion of the dummy MOS transistor in accordance with the first pulse voltage provided to the gate portion of the dummy MOS transistor,
a third voltage generated by differentially amplifying with the voltage generating device, the first voltage and the second voltage, and
a second pulse voltage generated by the superposition means based on the third voltage and the first pulse voltage is applied to the gate portion of the MOS transistor.

2. The solid-state imaging device voltage generation device according to claim 1, wherein the second pulse voltage is a voltage generated based on a potential of a channel portion provided beneath the gate portion of the dummy MOS transistor when the first pulse voltage is applied to the gate portion of the dummy MOS transistor.

3. The solid-state imaging device according to claim 1, wherein a gate length of the gate portion of the dummy MOS transistor is longer than a gate length of the gate portion of the MOS transistor.

4. The solid-state imaging device according to claim 1, wherein a gate width of the gate portion of the dummy MOS transistor is narrower than a gate width of the gate portion of the MOS transistor.

5. The solid-state imaging device according to claim 1, wherein a channel potential depth of a channel portion of the dummy MOS transistor is shallower than a channel potential depth of a channel portion of the MOS transistor.

6. The solid-state imaging device according to claim 1, wherein a channel portion of the MOS transistor and a channel portion of the dummy MOS transistor are formed by implanting an n-type impurity thereto, and
a p-type impurity is further implanted to the channel portion of the dummy MOS transistor.

7. The solid-state imaging device according to claim 1, wherein the MOS transistor and the dummy MOS transistor are formed on the same semiconductor substrate.

8. The solid-state imaging device according to claim 1, wherein a source portion of the dummy MOS transistor is shielded from light.

9. The solid-state imaging device according to claim 1, wherein the gate portion of the MOS transistor and the gate portion of the dummy MOS transistor are electrically connected to each other.

10. The solid state imaging device according to claim 1, wherein the first and second portions are source and drain electrodes, respectively.

11. The solid state imaging device according to claim 1, wherein the first and second portions are drain and source electrodes, respectively.

* * * * *